(12) United States Patent
Lee (10) Patent No.: US 10,008,274 B2
(45) Date of Patent: Jun. 26, 2018

(54) LOW VOLTAGE DETECTION CIRCUIT, NONVOLATILE MEMORY APPARATUS INCLUDING THE SAME, AND OPERATING METHOD THEREOF

(71) Applicant: SK hynix Inc., Icheon-si Gyeonggi-do (KR)

(72) Inventor: Hyun Chul Lee, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days. days.

(21) Appl. No.: 15/672,902

(22) Filed: Aug. 9, 2017

(65) Prior Publication Data

US 2017/0337975 A1    Nov. 23, 2017

Related U.S. Application Data

(62) Division of application No. 14/694,543, filed on Apr. 23, 2015, now Pat. No. 9,761,317.

(30) Foreign Application Priority Data

Dec. 18, 2014  (KR) .................. 10-2014-0183348

(51) Int. Cl.
*G11C 7/20* (2006.01)
*G11C 8/12* (2006.01)
*G11C 16/30* (2006.01)
*G01R 19/165* (2006.01)
*H03K 3/353* (2006.01)

(52) U.S. Cl.
CPC ........ *G11C 16/30* (2013.01); *G01R 19/16552* (2013.01); *H03K 3/353* (2013.01)

(58) Field of Classification Search
CPC .......... G11C 5/147; G11C 7/20; G11C 5/144; G11C 8/12
See application file for complete search history.

(56) References Cited

U.S. PATENT DOCUMENTS

| 7,091,769 B2 * | 8/2006 | Kwon ................ H02M 3/073 327/535 |
| 7,656,222 B2 | 2/2010 | Kwon |
| 2003/0122590 A1 | 7/2003 | Se |

FOREIGN PATENT DOCUMENTS

| KR | 1020030057884 A | 7/2003 |
| KR | 1020100054349 A | 5/2010 |

* cited by examiner

*Primary Examiner* — Hien Nguyen
(74) *Attorney, Agent, or Firm* — William Park & Associates Ltd.

(57) ABSTRACT

A low voltage detection circuit includes a first detection block configured to detect a level of an external voltage according to a reference voltage, and output a pre-detection signal; and a second detection block configured to generate a low voltage detection signal of a beginning level regardless of a variation in a level of the pre-detection signal when the level of the pre-detection signal is detected as the beginning level.

7 Claims, 6 Drawing Sheets

LOW VOLTAGE DETECTION CIRCUIT, NONVOLATILE MEMORY APPARATUS INCLUDING THE SAME, AND OPERATING METHOD THEREOF

CROSS-REFERENCES TO RELATED APPLICATION

The present application is a divisional application of U.S. application Ser. No. 14/694,543, filed on Apr. 23, 2015, and claims priority under 35 U.S.C. § 119(a) to Korean application number 10-2014-0183348, filed on Dec. 18, 2014, in the Korean Intellectual Property Office, which is incorporated herein by reference in its entirety.

BACKGROUND

1. Technical Field

Various embodiments generally relate to a semiconductor integrated apparatus, and more particularly, to a low voltage detection circuit, a nonvolatile memory apparatus including the same, and an operating method thereof.

2. Related Art

As an example of a nonvolatile memory apparatus, a flash memory apparatus may be mentioned. The flash memory apparatus needs a high voltage during an operation. To this end, the flash memory apparatus generates a high voltage by boosting an external voltage.

For instance, a flash memory apparatus should apply a high voltage of approximately 10V to approximately 20V to a word line, for an operation such as a program operation and an erase operation. If a voltage of a necessary level is not supplied, a normal operation may not be ensured.

Therefore, in order to retain a target voltage level necessary for an operation of a circuit, a semiconductor apparatus need be designed such that it is capable of monitoring an external voltage, an internal voltage, etc. and handling a voltage variation.

SUMMARY

In an embodiment, a low voltage detection circuit may include a first detection block configured to detect a level of an external voltage according to a reference voltage, and output a pre-detection signal. The low voltage detection circuit may also include a second detection block configured to generate a low voltage detection signal of a beginning level regardless of a variation in a level of the pre-detection signal when the level of the pre-detection signal is detected as the beginning level.

In an embodiment, a nonvolatile memory apparatus may include a memory region including a plurality of nonvolatile memory cells. The nonvolatile memory apparatus may also include a low voltage detection circuit configured to control an access to the memory region by being applied with an external voltage, and generate a low voltage detection signal of a beginning level regardless of a variation in a level of the external voltage when the level of the external voltage is detected as the beginning level.

In an embodiment, an operating method of a nonvolatile memory apparatus including a memory region controlled by a controller may include comparing a reference voltage and an external voltage as the external voltage is supplied, and outputting a pre-detection signal by the controller. The operating method may also include generating a low voltage detection signal of a beginning level regardless of a variation in a level of the pre-detection signal when the level of the pre-detection signal is detected as the beginning level by the controller.

DETAILED DESCRIPTION

Hereinafter, a low voltage detection circuit, a nonvolatile memory apparatus including the same, and an operating method will be described with reference to the accompanying figures through various embodiments.

Figure 1:
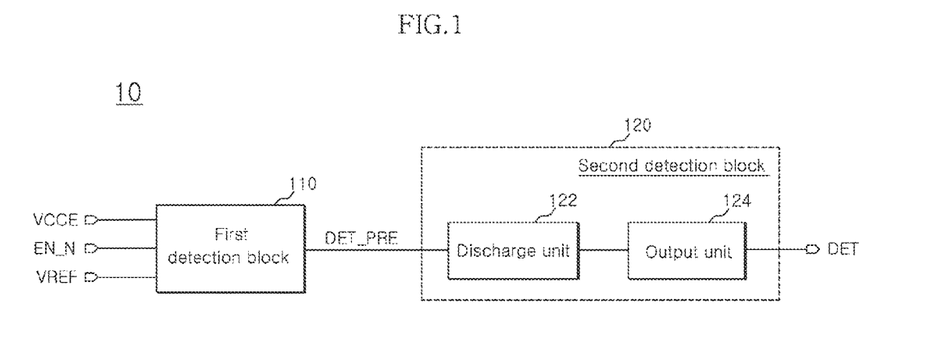
FIG. 1 is a configuration diagram illustrating a representation of an example of a low voltage detection circuit in accordance with an embodiment.

Referring to FIG. 1, a configuration diagram illustrating a representation of an example of a low voltage detection circuit in accordance with an embodiment is described.

The low voltage detection circuit 10 shown in FIG. 1 may include a first detection block 110 and a second detection block 120.

The first detection block 110 may be configured to detect the level of an external voltage VCCE based on a reference voltage VREF, in response to an enable signal EN_N. The first detection block 110 may also output a pre-detection signal DET_PRE.

The second detection block 120 may be configured to be driven by being supplied with the pre-detection signal DET_PRE. The second detection block 120 may also output a low voltage detection signal DET based on the level of the pre-detection signal DET_PRE. In an embodiment, the second detection block 120 may be configured to generate the low voltage detection signal DET of a first level regardless of a variation in the level of the pre-detection signal DET_PRE, after when the level of the pre-detection signal DET_PRE is detected as a first level. For example, the pre-detection signal DET_PRE may be detected as the first level where the level of the external voltage VCCE is lower than the reference voltage VREF. In an embodiment, the reference voltage VREF may be set to the level of a threshold low voltage LVCC.

The low voltage detection circuit 10 may output the pre-detection signal DET_PRE at the first level if the level of the external voltage VCCE drops to be equal to or lower than the level of the threshold low voltage LVCC. Further, the low voltage detection circuit 10 may retain the low voltage detection signal DET at the first level after the pre-detection signal DET_PRE is detected as the first level.

The external voltage VCCE may vary due to various causes. In this regard, a phenomenon may occur in which the external voltage VCCE fluctuates up and down by fine levels near the level of the threshold low voltage LVCC serving as a reference for detecting whether the external voltage VCCE has dropped or not. In this case, if the level of the external voltage VCCE rises to be finely higher than the threshold low voltage LVCC, the pre-detection signal DET_PRE may be outputted as a second level complementary to the first level. In addition, if the level of the external voltage VCCE falls to be finely lower than the threshold low voltage LVCC, the pre-detection signal DET_PRE may be outputted as the first level. Accordingly, where the level of the external voltage VCCE fluctuates near the threshold low voltage LVCC, the level of the pre-detection signal DET_PRE may be repeatedly changed to the first level and the second level.

The second detection block 120 may be configured to stabilize the level of the pre-detection signal DET_PRE which may fluctuate in this way. For example, after the level of the external voltage VCCE drops to be equal to or lower than the threshold low voltage LVCC and the pre-detection signal DET_PRE is outputted as the first level, the low voltage detection signal DET may be fixed to the first level.

The second detection block 120 may be configured to include a discharge unit 122 and an output unit 124.

The discharge unit 122 may be configured to determine the potential level of the input node of the output unit 124 according to the pre-detection signal DET_PRE. For example, the discharge unit 122 may be configured to discharge the input node of the output unit 124 where the pre-detection signal DET_PRE is outputted as the first level.

The output unit 124 may be configured to invert the potential level of the input node, based on whether the discharge unit 122 is driven or not. The output unit 124 may also generate the low voltage detection signal DET.

For example, if the pre-detection signal DET_PRE is detected as the first level, the discharge unit 122 may be driven and discharge the input node of the output unit 124. The output unit 124 may then invert the potential level of the input node, and generate the low voltage detection signal DET as the first level.

In an embodiment, in the initial operation of the low voltage detection circuit 10, the potential level of the input node of the output unit 124 may be set to a second level. Thereafter, the level of the low voltage detection signal DET may be determined based on the level of the external voltage VCCE.

Figure 2:
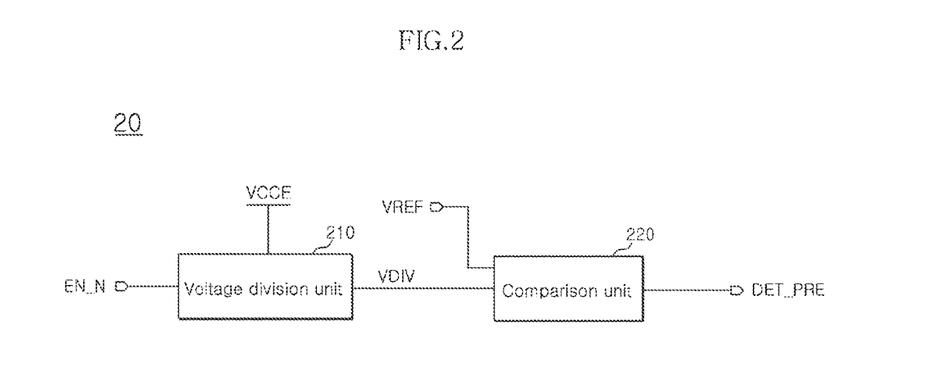
FIG. 2 is a configuration diagram illustrating a representation of an example of a first detection block in accordance with an embodiment.

Referring to FIG. 2, a configuration diagram illustrating a representation of an example of a first detection block in accordance with an embodiment is described.

In FIG. 2, the first detection block 20 may be configured to include a voltage division unit 210 and a comparison unit 220.

The voltage division unit 210 may be configured to generate a divided voltage VDIV from the external voltage VCCE according to the enable signal EN_N.

The comparison unit 220 may be configured to compare the divided voltage VDIV and the reference voltage VREF of a preset level. The comparison unit 220 may also generate the pre-detection signal DET_PRE. For example, where the level of the divided voltage VDIV is higher than the reference voltage VREF, the pre-detection signal DET_PRE may be outputted as the second level. Further, where the level of the divided voltage VDIV is lower than the reference voltage VREF, the pre-detection signal DET_PRE may be outputted as the first level. In an embodiment, the first level may be a logic high level, and the second level may be a logic low level.

Figure 3:
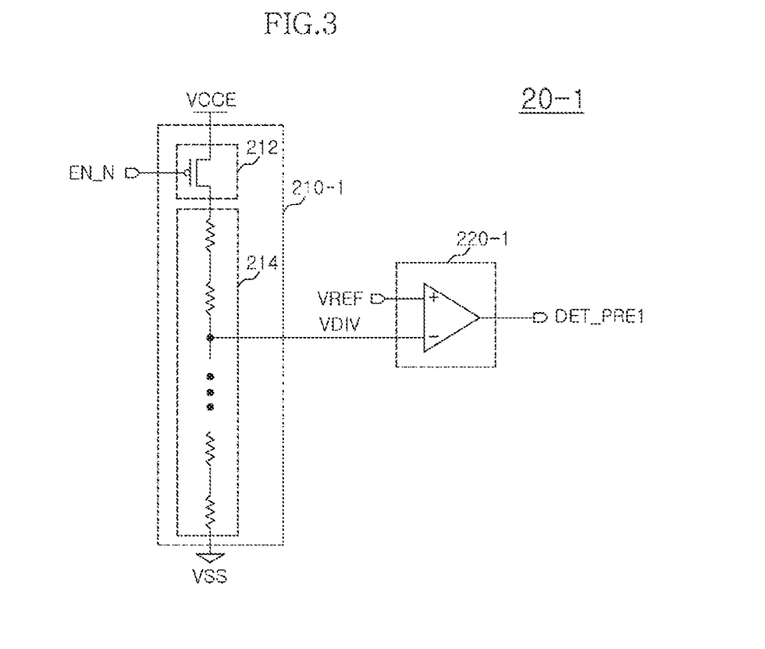
FIG. 3 is a circuit diagram illustrating a representation of an example of a first detection block in accordance with an embodiment.

Referring to FIG. 3, a circuit diagram illustrating a representation of an example of a first detection block in accordance with an embodiment is described.

The first detection block 20-1 shown in FIG. 3 may include a voltage division unit 210-1 and a comparison unit 220-1.

The voltage division unit 210-1 may include an external voltage supplying section 212 and a divided voltage generating section 214. The external voltage supplying section 212 may be configured to supply the external voltage VCCE to the divided voltage generating section 214 according to the enable signal EN_N. The divided voltage generating section 214 may be configured to generate a divided voltage VDIV from the external voltage VCCE supplied through the external voltage supplying section 212. The divided voltage generating section 214 may be configured to include, but not limited to, a plurality of resistor elements electrically coupled in series between the external voltage supplying section 212 and a ground terminal VSS.

The comparison unit 220-1 may be, but not limited to, an operational amplifier which compares the levels of the divided voltage VDIV and the reference voltage VREF and generates a first pre-detection signal DET_PRE1.

Figure 4:
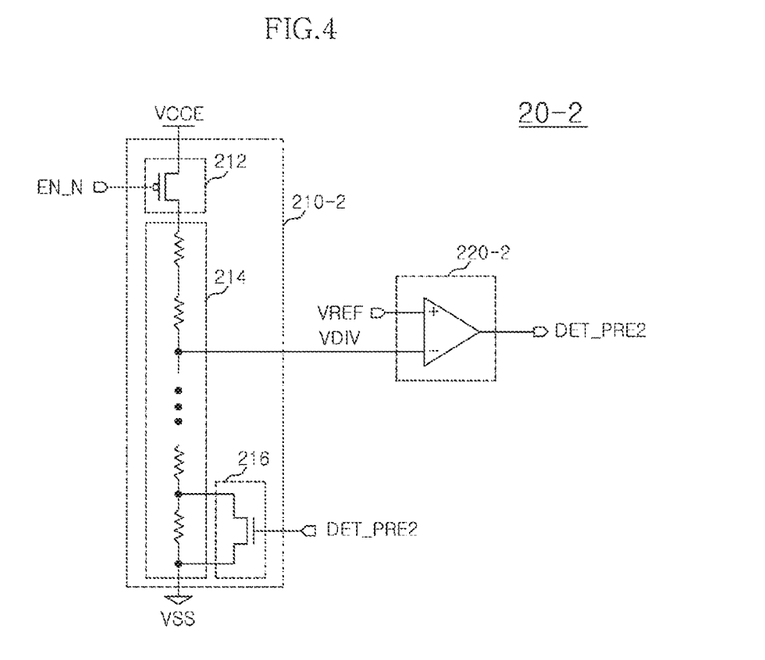
FIG. 4 is a circuit diagram illustrating a representation of an example of a first detection block in accordance with an embodiment.

Referring to FIG. 4, a circuit diagram illustrating a representation of an example of a first detection block in accordance with an embodiment is illustrated.

The first detection block 20-2 shown in FIG. 4 may include a voltage division unit 210-2 and a comparison unit 220-2.

The voltage division unit 210-2 may be configured to include an external voltage supplying section 212, a divided voltage generating section 214, and a level fixing section 216.

The external voltage supplying section 212 and the divided voltage generating section 214 may have configurations similar to those described above with reference to FIG. 3. The level fixing section 216 may be configured to drop the level of the divided voltage VDIV according to a second pre-detection signal DET_PRE2. For instance, the level fixing section 216 may be configured by, but not limited to, a switching element driven according to the second pre-detection signal DET_PRE2 and is electrically coupled between the input terminal of the resistor element directly electrically coupled to the ground terminal VSS, among the resistor elements configuring the divided voltage generating section 214, and the ground terminal VSS.

The comparison unit 220-2 may be, but not limited to, an operational amplifier which compares the levels of the divided voltage VDIV and the reference voltage VREF and generates the second pre-detection signal DET_PRE2.

Accordingly, if the second pre-detection signal DET_PRE2 is detected as the first level, the level fixing section 216 is driven. Therefore, the level of the divided voltage VDIV may be decreased by a preselected level when compared where the level fixing section 216 is not provided.

In FIGS. 3 and 4, the first pre-detection signal DET_PRE1 and the second pre-detection signal DET_PRE2 have been separately described. This is only to distinguish the output signal of the first detection block 110 according to the design scheme of the first detection block 110. In other words, the pre-detection signal DET_PRE, the first pre-detection signal DET_PRE1 and the second pre-detection signal DET_PRE2 described above should be understood as substantially the same signals.

Figure 5:
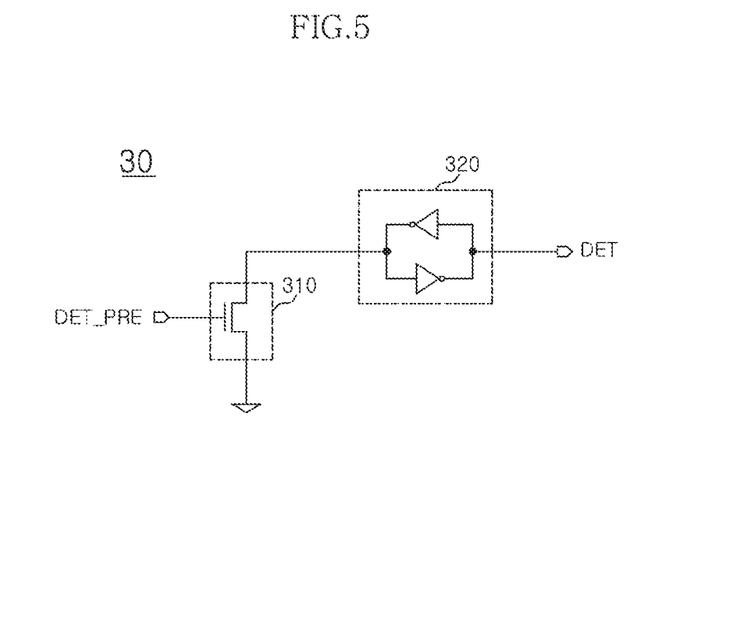
FIG. 5 is a circuit diagram illustrating a representation of an example of a second detection block in accordance with an embodiment.

Referring to FIG. 5, a circuit diagram illustrating a representation of an example of a second detection block in accordance with an embodiment is described.

In FIG. 5, the second detection block 30 may be configured to include a discharge unit 310 and an output unit 320.

The discharge unit 310 may include a switching element electrically coupled between the input node of the output unit 320 and a ground terminal and driven in response to the pre-detection signal DET_PRE.

The output unit 320 may invert the potential level of the input node, based on whether the discharge unit 310 is driven or not. The output unit 320 may also generate the low voltage detection signal DET. For example, the output unit 320 may be configured to include a latch circuit.

Where the pre-detection signal DET_PRE is detected as the first level, for example, the high level, and thus the discharge unit 310 is driven, the potential level of the input node of the output unit 320 may be the low level. Accordingly, the output unit 320 may generate the low voltage detection signal DET as the first level, that is, the high level.

It is assumed that the level of the external voltage VCCE fluctuates up and down by fine levels near the level of the threshold low voltage LVCC. Accordingly, the level of the pre-detection signal DET_PRE is repeatedly changed to the first level and the second level.

If the level of the external voltage VCCE is lower than the level of the threshold low voltage LVCC and thus the pre-detection signal DET_PRE is detected as the first level, for example, the high level, the discharge unit 310 discharges the input node of the output unit 320. Therefore, the output unit 320 generates the low voltage detection signal DET as the first level, that is, the high level. In this state, if the level of the external voltage VCCE becomes finely higher than the level of the threshold low voltage LVCC, the pre-detection signal DET_PRE is detected as the second level, for example, the low level. Further, the discharge unit 310 is turned off. The input node of the output unit 320 is retained as the low level of the previous state. Accordingly, the level of the low voltage detection signal DET generated by the output unit 320 may be retained as the high level.

As a result, where the external voltage VCCE varies frequently and repeatedly fluctuates up and down near the level of the threshold low voltage LVCC, the low voltage detection signal DET may not toggle and be outputted at a fixed level.

Figure 6:
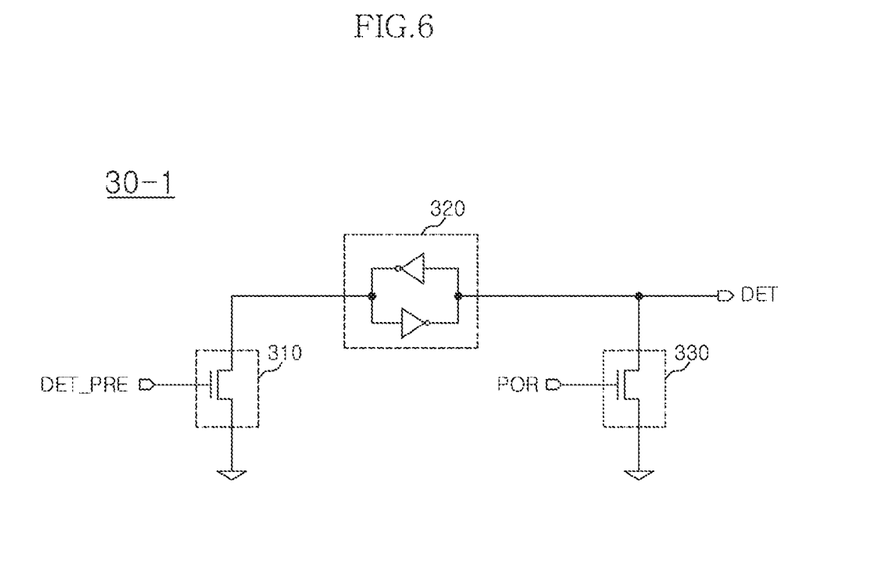
FIG. 6 is a circuit diagram illustrating a representation of an example of a second detection block in accordance with an embodiment.

Referring to FIG. 6, a circuit diagram illustrating a representation of an example of a second detection block in accordance with an embodiment is described.

Similarly to the illustration of FIG. 5, a second detection block 30-1 may include a discharge unit 310 and an output unit 320. In addition, the second detection block 30-1 may further include an initialization unit 330.

The initialization unit 330 may include a switching element electrically coupled between the output terminal of the low voltage detection signal DET and a ground terminal and is driven according to an initialization signal POR.

The initialization signal POR may be generated based on a power-on reset signal generated upon power-off or power-up. If the initialization signal POR is enabled, the low voltage detection signal DET may be initialized to the second level, for example, the low level.

Figure 7:
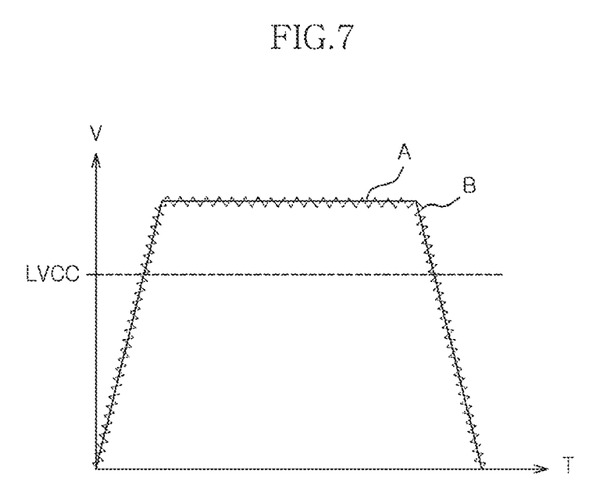
FIG. 7 is a representation of an example of a waveform diagram to assist in the explanation of the supply level of an external voltage.

Referring to FIG. 7, a representation of an example of a waveform diagram to assist in the explanation of the supply level of an external voltage is described.

The external voltage VCCE may be gradually increased after being supplied and be stabilized when it reaches a predetermined level. If the supply of the external voltage VCCE is interrupted, the external voltage VCCE may be gradually decreased. In an ideal situation, the external voltage VCCE has the pattern of the graph A. However, noise may be mixed due to various factors. Further, a phenomenon may occur, in which the external voltage VCCE fluctuates up and down near the level of the threshold low voltage LVCC.

Figure 8A:
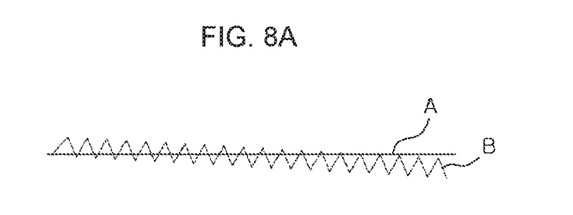
FIGS. 8A and 8B are a representation of an example of a waveform diagram to assist in the explanation of the output of a detection signal according to a variation of an external voltage in accordance with an embodiment.
Figure 8B:
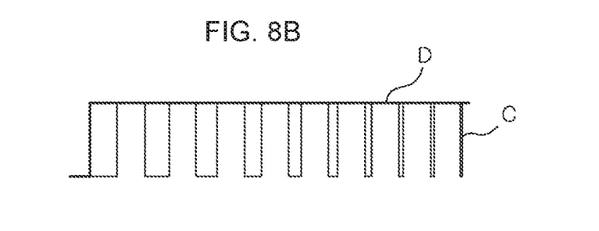

Referring to FIGS. 8A and 8B, a representation of an example of a waveform diagram to assist in the explanation of the output of a detection signal according to a variation of an external voltage in accordance with an embodiment is described.

For example, it is assumed that the low voltage detection circuit 10 is configured by using the first detection block 20-1 shown in FIG. 3.

Reference letter (a) represents an ideal external voltage VCCE A near the level of the threshold low voltage LVCC and an external voltage B mixed with noise.

The first pre-detection signal DET_PRE1 outputted from the first detection block 20-1 consecutively toggles to the first level and the second level as in the waveform C in (b). However, the input node of the output unit 124 may be fixed to the second level by the discharge unit 122 of the second detection block 120. Further, the output unit 124 may output the low voltage detection signal DET by fixing it to the first level as in the waveform D in (b).

Figure 9A:
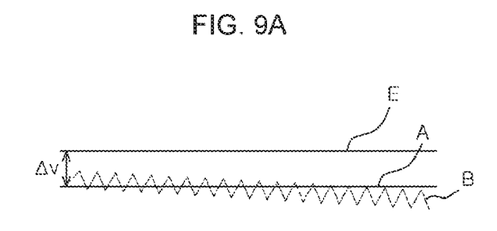
FIGS. 9A and 9B are a representation of an example of a waveform diagram to assist in the explanation of the output of a detection signal according to a variation of an external voltage in accordance with an embodiment.
Figure 9B:
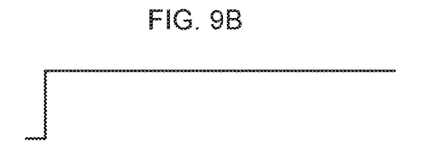

Referring to FIGS. 9A and 9B, a representation of an example of a waveform diagram to assist in the explanation of the output of a detection signal according to a variation of an external voltage in accordance with an embodiment is described. For example, it may be understood that FIGS. 9A and 9B where the low voltage detection circuit 10 is configured using the first detection block 20-2 shown in FIG. 4.

When compared to the case where the level fixing section 216 is not provided, since the first detection block 20-2 additionally includes the level fixing section 216, the level of the divided voltage VDIV may be further lowered.

As a result, the reference voltage VREF (see the waveform E in (a)) serving as a reference for determining whether the external voltage VCCE is lower than the threshold low voltage LVCC has a level that is higher by $\Delta v$ than the external voltage VCCE near the threshold low voltage LVCC.

The waveform A represents an ideal external voltage VCCE near the level of the threshold low voltage LVCC. Further, the waveform B represents an external voltage mixed with noise.

In this case, the second pre-detection signal DET_PRE2 outputted from the first detection block 20-2 is generated as the first level. In addition, the second detection block 120 may output the low voltage detection signal DET by fixing it to the first level as in (b).

Figure 10:
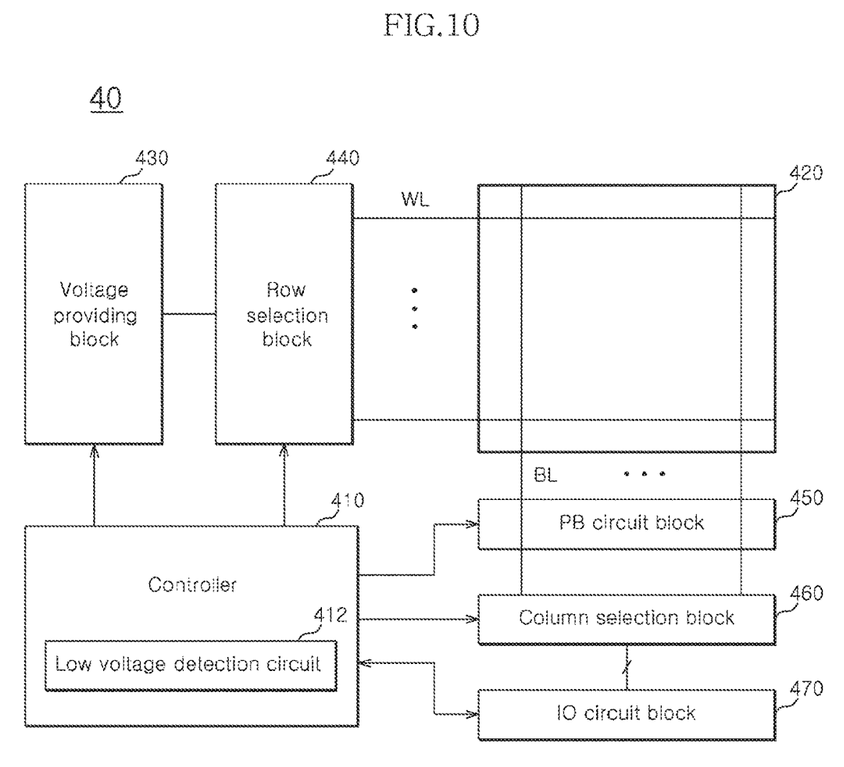
FIG. 10 is a configuration diagram illustrating a representation of an example of a nonvolatile memory apparatus in accordance with an embodiment.

Referring to FIG. 10, a configuration diagram illustrating a representation of an example of a nonvolatile memory apparatus in accordance with an embodiment is shown.

A nonvolatile memory apparatus 40 may include a controller 410, a memory region 420, a voltage providing block 430, a row selection block 440, a page buffer circuit block 450, a column selection block 460, and an input/output circuit block 470.

The controller 410 may control the general operations of the nonvolatile memory apparatus 40 according to the signals provided from an exterior.

The memory region 420 may be configured to include a plurality of blocks. In addition, the plurality of memory cells included in the respective blocks may be electrically coupled as string structures between word lines WL and bit lines BL. The memory cells configuring the memory region 420 may be nonvolatile memory cells, for example, flash memory cells. Further, the memory cells may be realized as single level cells or multi-level cells.

The voltage providing block 430 may pump an external voltage according to the control of the controller 410. In an embodiment, the voltage providing block 430 may include at least one pump. The voltage providing block 430 may provide a high voltage of a preset level to the row selection block 440 according to an operation mode of the nonvolatile memory apparatus 40.

The row selection block 440 decodes a row address to access a target memory cell, according to the control of the controller 410.

The page buffer circuit block 450 may be electrically coupled to the bit lines BL which extend from the memory region 420. The page buffer circuit block 450 may latch data to be programmed in the memory region 420 or the data read from the memory region 420.

The column selection block 460 may decode a column address according to the control of the controller 410. The column selection block 460 may also select a page buffer electrically coupled to a memory cell to access.

The input/output circuit block 470 may provide the data inputted from an exterior, to the page buffer circuit block 450. In the alternative, the input/output circuit block 470 may provide the data read from the memory region 420, to the controller 410, according to the control of the controller 410.

In a semiconductor memory apparatus, the level of the power supplied from an exterior trends to be gradually lowered. However, it is a frequent occurrence that a voltage of a level higher than external power is needed internally of a semiconductor apparatus. In particular, in a nonvolatile memory apparatus such as a flash memory apparatus, a high voltage of a level higher than the voltage provided from an exterior is needed according to an operation mode.

In the program, read and erase operations of the nonvolatile memory apparatus 40, a high voltage should be supplied to the word line WL of memory cells. If the level of an external voltage (VCCE) decreases lower than a predetermined level, since it is difficult to normally perform an operation, it is necessary to monitor the external voltage. The controller 410 may include a low voltage detection circuit 412. As the low voltage detection circuit 412, the low voltage detection circuit described above with reference to FIGS. 1 to 6 may be used.

If it is detected by the low voltage detection circuit 412 that the level of the external voltage has dropped, the controller 410 may perform a series of operations for correcting an error while not exerting an influence on the operation of the nonvolatile memory apparatus 40.

Figure 11:
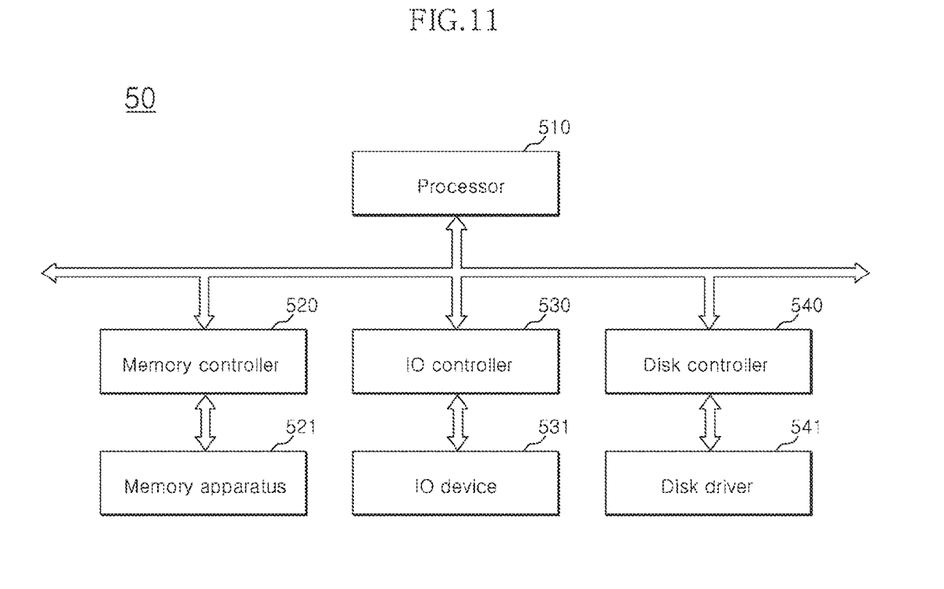
FIG. 11 is a configuration diagram illustrating a representation of an example of an electronic system in accordance with an embodiment.

Referring to FIG. 11, a configuration diagram illustrating a representation of an example of an electronic system in accordance with an embodiment is described.

An electronic system 50 in accordance with an embodiment may include a processor 510, a memory controller 520, a memory apparatus 521, an IO controller 530, an IO device 531, a disk controller 540, and a disk driver 541.

At least one processor 510 may be provided. The processor 510 may operate independently or in cooperation with another processor. The processor 510 has an environment capable of communicating with other elements. The other elements may be for example, the memory controller 520, the JO controller 530 and the disk controller 540, through a bus (a control bus, an address bus, or a data bus).

The memory controller 520 is electrically coupled with at least one memory apparatus 521. The memory controller 520 receives a request provided from the processor 510. The memory controller 520 also controls the at least one memory apparatus 521 based on the request.

The memory apparatus 521 may be, for example, a nonvolatile memory apparatus including the low voltage detection circuit described above with reference to FIGS. 1 to 6.

The IO controller 530 may be electrically coupled between the processor 510 and the IO device 531. The IO controller 530 may also transfer an input from the IO device 531 to the processor 510 or provide a processing result of the processor 510 to the IO device 531. The IO device 531 may include an input device such as a keyboard, a mouse, a touch screen and a microphone and an output device such as a display and a speaker.

The disk controller 540 may control at least one disk driver 541 according to the control of the processor 510.

In such an electronic system 50, when the level of the external voltage supplied to the memory apparatus 521 fluctuates up and down near the level of a threshold low voltage (LVCC), the memory apparatus 521 may efficiently detect and correct an error.

While various embodiments have been described, it will be understood to those skilled in the art that the embodiments described are by way of examples only. Accordingly, the low voltage detection circuit, the nonvolatile memory apparatus including the same, and the operating method thereof described should not be limited based on the described embodiments above.

What is claimed is:

1. An operating method of a nonvolatile memory apparatus including a memory region controlled by a controller, the operating method comprising:
   comparing a reference voltage and an external voltage as the external voltage is supplied, and outputting a pre-detection signal by the controller; and
   generating a low voltage detection signal having a predetermined level regardless of a variation in the level of the external voltage when the level of the pre-detection signal is detected as the predetermined level by the controller.

2. The operating method according to claim 1, further comprising:
   initializing the low voltage detection signal according to an initialization signal by the controller.

3. The operating method according to claim 1, wherein the outputting of the pre-detection signal comprises:

generating a divided voltage from the external voltage by the controller; and comparing the divided voltage and the reference voltage and generating the pre-detection signal by the controller.

4. The operating method according to claim 1, further comprising:

performing a series of operations for correcting an error when a level of the external voltage has dropped by the controller.

5. The operating method according to claim 1, further comprising:

performing a series of operations for correcting an error regardless of an operation by a nonvolatile memory apparatus by the controller.

6. The operating method according to claim 1, further comprising:

monitoring the external voltage when a level of the external voltage decreases below a predetermined level by a low voltage detection circuit.

7. The operating method according to claim 1, further comprising:

pumping the external voltage and providing a voltage of a preset level to a row selection block according to an operation mode of a nonvolatile memory apparatus by a voltage providing block.

* * * * *